United States Patent [19]

Osada et al.

[11] Patent Number: 6,162,878
[45] Date of Patent: Dec. 19, 2000

[54] SEMICONDUCTOR ENCAPSULATING EPOXY RESIN COMPOSITION AND SEMICONDUCTOR DEVICE

[75] Inventors: Shoichi Osada; Kazutoshi Tomiyoshi; Eiichi Asano; Takayuki Aoki; Toshio Shiobara, all of Gunma-ken, Japan

[73] Assignee: Shin-Etsu Chemical Co., Ltd., Tokyo, Japan

[21] Appl. No.: 09/310,999

[22] Filed: May 13, 1999

[30] Foreign Application Priority Data

May 15, 1998 [JP] Japan ................................. 10-152071

[51] Int. Cl.⁷ .......................... C08G 59/08; C08G 59/62
[52] U.S. Cl. .......................... 525/481; 528/421; 257/793; 549/215; 549/512; 428/413; 523/400; 524/497; 524/442
[58] Field of Search ................... 428/413; 528/421; 549/215, 512; 523/400; 525/481; 524/497, 442; 556/482, 459, 458

[56] References Cited

U.S. PATENT DOCUMENTS

| | | |
|---|---|---|
| 2,766,139 | 10/1956 | Green, Jr. et al. . |
| 3,373,135 | 3/1968 | Jenkner et al. . |
| 3,398,019 | 8/1968 | Langguth et al. . |
| 4,632,946 | 12/1986 | Muench et al. . |
| 4,902,732 | 2/1990 | Itoh et al. . |
| 5,360,837 | 11/1994 | Honda et al. . |
| 5,434,199 | 7/1995 | Gallagher et al. . |
| 5,476,884 | 12/1995 | Kayaba et al. . |
| 5,567,749 | 10/1996 | Sawamura et al. . |
| 5,739,186 | 4/1998 | Hayakawa et al. . |
| 6,027,812 | 2/2000 | Shiobara et al. . |

OTHER PUBLICATIONS

Flame Retardanncy of Polymeric Materials vol. 1, pp. 24–38, pp. 52–61 (Marcel Pekker Inc., New York).

*Primary Examiner*—Robert Dawson
*Assistant Examiner*—Kuo-Liang Peng
*Attorney, Agent, or Firm*—Birch, Stewart, Kolasch & Birch, LLP

[57] ABSTRACT

An epoxy resin composition comprising (A) a biphenyl skeleton-bearing epoxy resin, (B) a biphenyl skeleton-bearing phenolic resin as a curing agent, (C) an organosiloxane containing phenyl and organooxy groups, and (D) an inorganic filler is suited for semiconductor encapsulation since it is effectively moldable and cures into a part having improved reflow crack resistance, moisture resistance, and flame retardance. It does not pose a hazard to human health or the environment.

13 Claims, No Drawings

SEMICONDUCTOR ENCAPSULATING EPOXY RESIN COMPOSITION AND SEMICONDUCTOR DEVICE

This invention relates to an epoxy resin composition for semiconductor encapsulation which is effectively moldable and cures into a product having high-temperature storage stability, reflow crack resistance and flame retardance. It also relates to a semiconductor device encapsulated with a cured product of the composition.

BACKGROUND OF THE INVENTION

The current mainstream in the semiconductor industry resides in diodes, transistors, ICs, LSIs and VLSIs of the resin encapsulation type. Epoxy resins are generally used as the encapsulating resin because they have superior moldability, adhesion, electrical properties, mechanical properties, and moisture resistance to other thermosetting resins. It is thus a common practice to encapsulate semiconductor devices with epoxy resin compositions.

Recently, halogenated epoxy resins combined with antimony trioxide are often blended in epoxy resin compositions in order to clear the V-0 rating of Underwriters Laboratory flame retardant standard UL-94. This combination of a halogenated epoxy resin with antimony trioxide has great radical-trapping and air-shielding effects in the vapor phase, thus conferring a high fire-retarding effect. However, halogenated epoxy resins generate noxious gases during combustion, and antimony trioxide has powder toxicity. Given their negative impact on human health and the environment, these fire retardants are not suitable for resin compositions and it is desirable to entirely exclude these fire retardants from resin compositions.

In view of the above demand, studies have been conducted on the use of hydroxides such as $Al(OH)_3$ and $Mg(OH)_2$ or phosphorus-containing fire retardants in place of halogenated epoxy resins and antimony trioxide. Unfortunately, because of various problems associated with the use of these alternative compounds, such as inferior curability of the resin composition during molding and poor moisture resistance in the cured product, they are not yet ready for practical application.

SUMMARY OF THE INVENTION

An object of the invention is to provide an epoxy resin composition for semiconductor encapsulation which is effectively moldable and cures into a product having high-temperature storage stability, reflow crack resistance, flame retardance, and safety. Another object is to provide a semiconductor device encapsulated with a cured product of the composition.

The inventors have found that by blending a phenyl and organooxy-bearing organosiloxane of the following general formula (3) as a flame retardant in an epoxy resin composition for semiconductor encapsulation comprising an epoxy resin of the following general formula (1), a phenolic resin curing agent of the following general formula (2), and an inorganic filler as essential components, there is obtained an epoxy resin composition which is effectively moldable and cures into a product having improved reflow crack resistance, moisture resistance, high flame retardance, and safety. Then a semiconductor device encapsulated with the cured epoxy resin composition remains highly reliable.

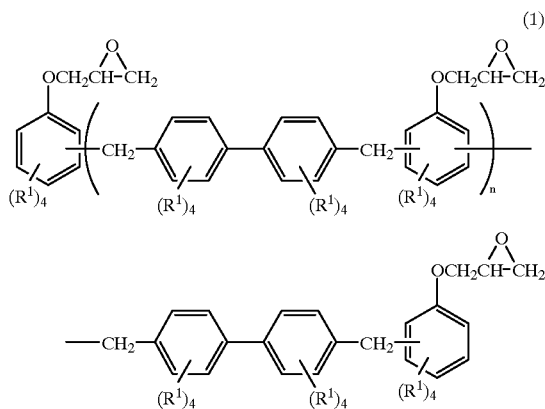

Herein $R^1$ which may be the same or different is a hydrogen atom, an alkyl group of 1 to 4 carbon atoms, or a phenyl group, and n is an integer of 0 to 10.

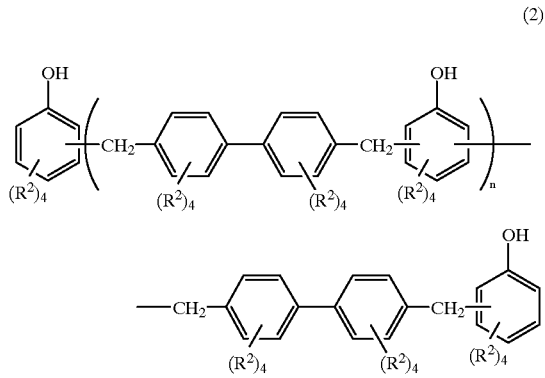

Herein $R^2$ which may be the same or different is a hydrogen atom, an alkyl group of 1 to 4 carbon atoms, or a phenyl group, and m is an integer of 0 to 10.

$$R^3_a R^4_b Si(OR^5)_c(OH)_d O_{(4-a-b-c-d)/2} \quad (3)$$

Herein $R^3$ is a phenyl group, $R^4$ is a hydrogen atom or a monovalent hydrocarbon group of 1 to 6 carbon atoms, $R^5$ is a monovalent hydrocarbon group of 1 to 4 carbon atoms, a, b, c and d are numbers satisfying $0.5 \leq a \leq 2$, $0 \leq b \leq 1$, $0.42 \leq c \leq 2.5$, $0 \leq d \leq 0.35$, and $0.92 \leq a+b+c+d \leq 2.8$.

Since the semiconductor-encapsulating epoxy resin composition of the invention is based on an epoxy resin of formula (1) combined with a phenolic resin curing agent of formula (2) and a phenyl and organooxy-bearing organosiloxane of formula (3), oxidative destruction/crosslinking of organooxy groups such as alkoxy groups and alkenyloxy groups in the organosiloxane molecule of formula (3) occurs during burning whereby the organosiloxane is bonded with the aromatic ring-bearing epoxy resin of formula (1) and fixed in proximity to burnt sites. Additionally, owing to coupling of aromatic rings between the phenyl groups richly contained in the organosiloxane molecule of formula (3) and the aromatic ring-bearing epoxy resin of formula (1), an incombustible Si—C ceramic layer is readily formed, achieving high flame retardance. Accordingly, the composition of the invention achieves sufficient flame retardance without a need for halogenated resins, eliminates the problem of powder toxicity as with antimony trioxide, and is effectively moldable. The composition cures into a product which is improved in many properties including moisture resistance while exhibiting high flame retardant properties.

Accordingly, the present invention provides an epoxy resin composition for semiconductor encapsulation comprising, in admixture, (A) an epoxy resin of formula (1), (B) a phenolic resin curing agent of formula (2), (C) a phenyl and organooxy-bearing organosiloxane of average compositional formula (3), and (D) an inorganic filler.

Also contemplated herein is a semiconductor device encapsulated with a cured product of the composition.

DETAILED DESCRIPTION OF THE INVENTION

In the semiconductor-encapsulating epoxy resin composition of the invention, both the epoxy resin of formula (1) as component (A) and the phenolic resin curing agent of formula (2) as component (B) are resins having biphenyl and phenol skeletons, respectively. A combination of these resins affords a cured product having a low water absorption, high toughness and improved reflow crack resistance. The combination is a highly heat resistant material because of a high thermal decomposition initiating temperature and a low rate of thermal decomposition.

Component (A) is an epoxy resin of the following general formula (1), which is a phenolaralkyl type epoxy resin having a biphenyl skeleton or an epoxy resin having a biphenylaralkyl skeleton.

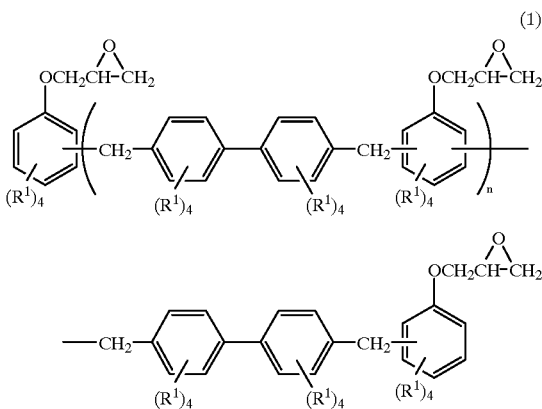

Herein, $R^1$ represents identical or different atoms or groups selected from the class consisting of a hydrogen atom, an alkyl group of 1 to 4 carbon atoms, and a phenyl group. Exemplary alkyl groups are methyl, ethyl, n-propyl, isopropyl, n-butyl, isobutyl, and t-butyl. Letter n is an integer of 0 to 10, preferably 0 to 4, and more preferably 0 to 2.

Illustrative examples of the epoxy resin of formula (1) are given below.

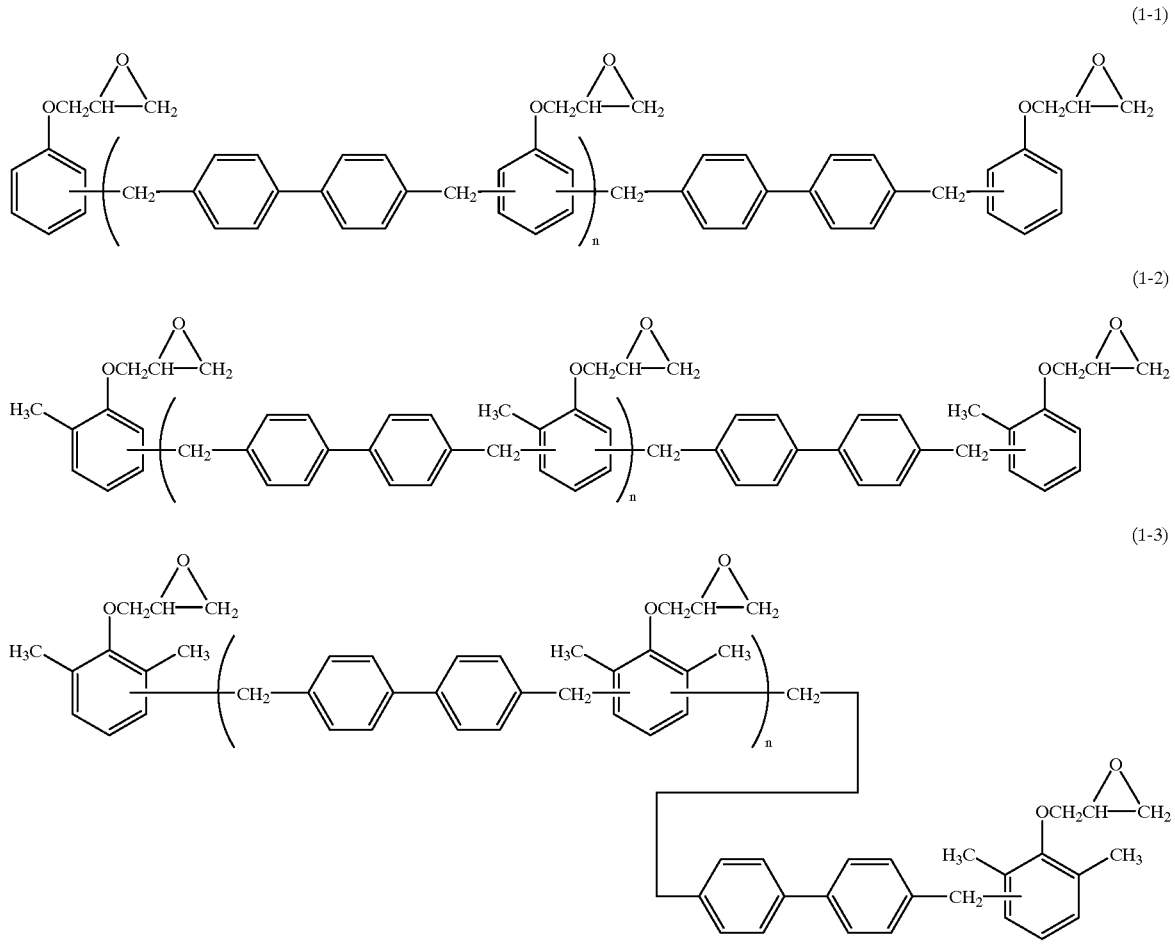

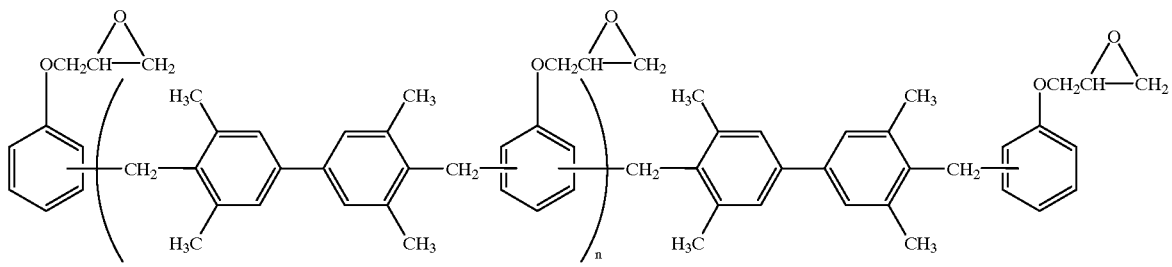

(1-4)

In the formulae, n is an integer of 0 to 10, preferably 0 to 4, and more preferably 0 to 2.

Desirably, the epoxy resin of formula (1) has a melt viscosity of 0.1 to 2.5 poises, especially 0.1 to 0.8 poise as measured at 150° C. by a cone plate type ICI viscometer. An epoxy resin with a melt viscosity of more than 2.5 poises would become extremely low in melt flow when the loading of inorganic filler is made as high as 80 to 90% by weight in order to improve reflow crack resistance. An epoxy resin with a melt viscosity of less than 0.1 poise tend to generate internal voids during molding, losing reliability.

As the epoxy resin, another epoxy resin may be used in combination with the epoxy resin of formula (1), if desired. Examples of the other epoxy resin which can be combined include novolac type epoxy resins such as phenol novolac type epoxy resins and cresol novolac type epoxy resins; triphenolalkane type epoxy resins such as triphenolmethane type epoxy resins and triphenolpropane type epoxy resins; biphenyl type epoxy resins; phenolaralkyl type epoxy resins free of a biphenyl skeleton; heterocyclic epoxy resins; naphthalene ring-containing epoxy resins; bisphenol type epoxy resins such as bisphenol A type epoxy resins and bisphenol F type epoxy resins, and stilbene type epoxy resins. These epoxy resins may be used alone or in admixture of two or more. Of these, biphenyl type epoxy resins, bisphenol A type epoxy resins, bisphenol F type epoxy resins, and stilbene type epoxy resins are preferable because they exhibit a low viscosity when melted.

The amount of the epoxy resin of formula (1) blended is desirably 50 to 100% by weight, more desirably 70 to 100% by weight based on the total weight of epoxy resins (that is, epoxy resin of formula (1) plus other epoxy resins). Less than 50% by weight of the epoxy resin of formula (1) would fail to achieve satisfactory reflow crack resistance and flame retardance.

Component (B) is a phenolic resin curing agent of the following general formula (2), which is an aralkyl type phenolic resin having a biphenyl skeleton or a phenolic resin having a biphenylaralkyl skeleton.

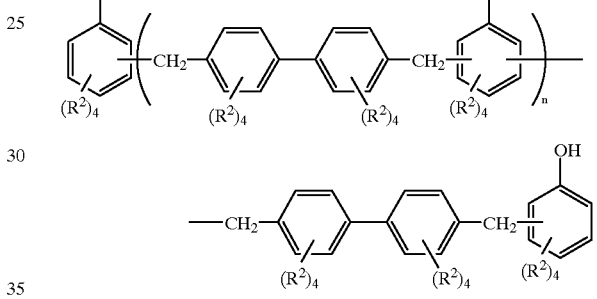

(2)

Herein, $R^2$ represents identical or different atoms or groups selected from the class consisting of a hydrogen atom, an alkyl group of 1 to 4 carbon atoms, and a phenyl group. Exemplary alkyl groups are methyl, ethyl, n-propyl, isopropyl, n-butyl, isobutyl, and t-butyl. Letter m is an integer of 0 to 10, preferably 0 to 4, and more preferably 0 to 2.

Illustrative examples of the epoxy resin of formula (2) are given below.

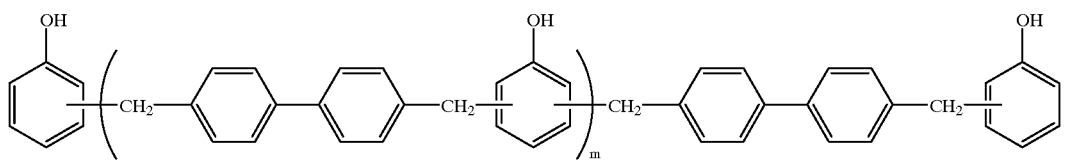

(2-1)

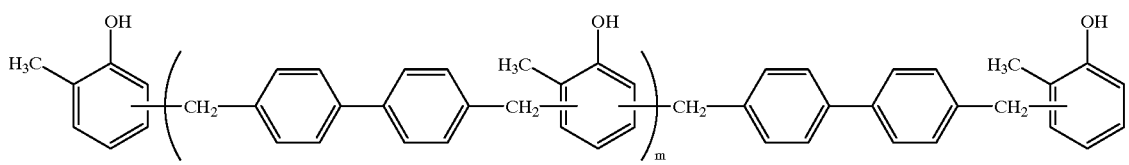

(2-2)

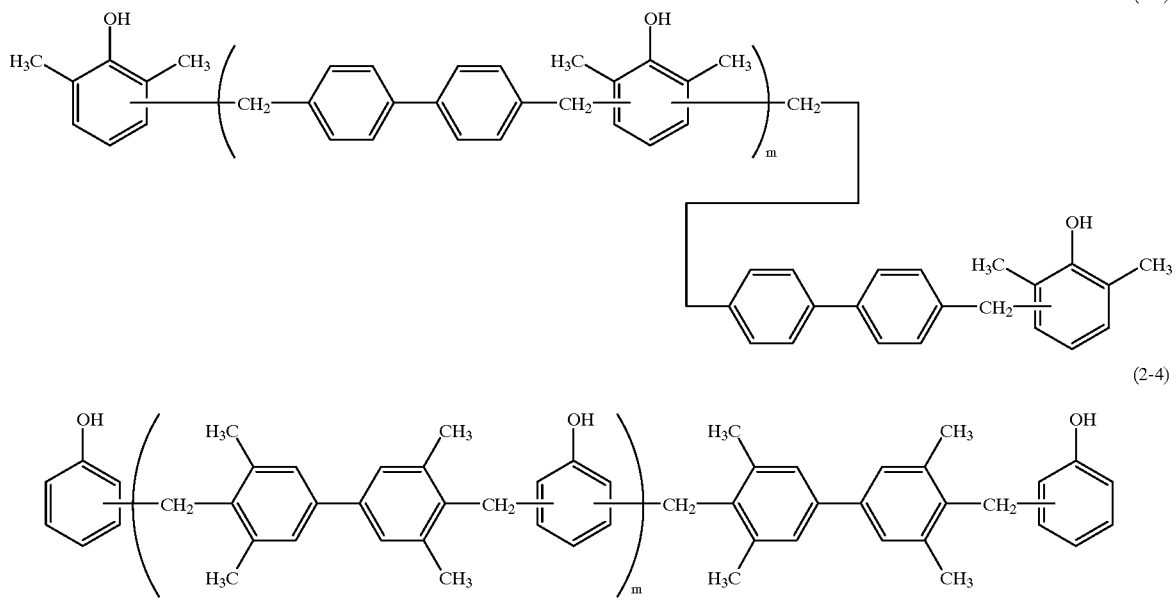

(2-3)

(2-4)

In the formulae, m is an integer of 0 to 10, preferably 0 to 4, and more preferably 0 to 2.

Desirably, the phenolic resin of formula (2) as the curing agent has a melt viscosity of 0.1 to 1.2 poises, especially 0.2 to 0.8 poise as measured at 150° C. by a cone plate type ICI viscometer. The reason of limitation is the same as described for the epoxy resin.

In the practice of the invention, another curing agent may be used in combination with the phenolic resin curing agent, if desired. Examples of the other curing agent include novolac type phenolic resins such as phenol novolac resins and cresol novolac resins; naphthalene ring-containing phenolic resins; phenolaralkyl type phenolic resins free of a biphenyl skeleton; biphenyl type phenolic resins; triphenolalkane type phenolic resins such as triphenolmethane type phenolic resins and triphenolpropane type phenolic resins; alicyclic phenolic resins; heterocyclic phenolic resins; and bisphenol type phenolic resins such as bisphenol A type phenolic resins and bisphenol F type phenolic resins. Any one or combination of two or more of these phenolic resins may be employed.

The amount of the phenolic resin curing agent of formula (2) blended is desirably 50 to 100% by weight, more desirably 70 to 100% by weight based on the total weight of phenolic resin curing agents (that is, phenolic resin of formula (2) plus other phenolic resins). Less than 50% by weight of the phenolic resin of formula (2) would fail to achieve satisfactory reflow crack resistance and flame retardance.

The epoxy resin (A) and the curing agent (B) are blended in any desired ratio and preferably in such a ratio that 0.5 to 1.5 mol, especially 0.8 to 1.2 mol of phenolic hydroxyl groups in all the phenolic resin curing agent in the composition is available per mol of epoxy groups in all the epoxy resin in the composition.

In the semiconductor-encapsulating epoxy resin composition of the invention, an organosiloxane compound of the following average compositional formula (3) is blended as a flame retardant (C).

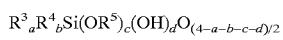

(3)

Herein $R^3$ is a phenyl group, $R^4$ is a hydrogen atom or a monovalent hydrocarbon group of 1 to 6 carbon atoms, $R^5$ is a monovalent hydrocarbon group of 1 to 4 carbon atoms, a, b, c and d are numbers satisfying $0.5 \leq a \leq 2$, $0 \leq b \leq 1$, $0.42 \leq c \leq 2.5$, $0 \leq d \leq 0.35$, and $0.92 \leq a+b+c+d \leq 2.8$.

More particularly, in formula (3), $R^4$ is a hydrogen atom or a monovalent hydrocarbon group of 1 to 6 carbon atoms, preferred examples of which are alkyl groups of 1 to 6 carbon atoms and alkenyl groups of 2 to 6 carbon atoms. Illustrative examples of the alkyl groups include methyl, ethyl, propyl, isopropyl, butyl, isobutyl, tert-butyl, pentyl, cyclohexyl, and hexyl; and exemplary alkenyl groups are vinyl, allyl, propenyl, isopropenyl, butenyl, isobutenyl, and hexenyl. Methyl and vinyl are industrially preferred as $R^4$ from the standpoint of alleviating steric hindrance.

$R^5$ represents monovalent hydrocarbon groups of 1 to 4 carbon atoms, such as alkyl and alkenyl groups. Of the monovalent hydrocarbon groups exemplified for $R^4$, those having 1 to 4 carbon atoms are exemplary of the group represented by $R^5$. Preferred are alkyl groups of 1 to 4 carbon atoms, for example, methyl, ethyl, propyl, isopropyl, butyl, isobutyl, and tert-butyl. If $R^5$ is an alkyl group of more than 4 carbon atoms, the alkoxy group ($OR^5$) is less reactive so that the flame retarding effect is not expectable.

The epoxy resin composition of the invention achieves high flame retardance through the following mechanism. As previously described, organooxy ($OR^5$) groups, typically alkoxy groups, in the organosiloxane molecule of formula (3) undergo oxidative destruction/crosslinking during burning whereby the organosiloxane is bonded with the aromatic ring-bearing epoxy resin of formula (1) and fixed in proximity to burnt sites. Additionally, mutual coupling of aromatic rings occurs between the phenyl groups richly contained in the organosiloxane molecule of formula (3) and the aromatic ring-bearing epoxy resin of formula (1), whereby an incombustible Si—C ceramic layer is readily formed, achieving high flame retardance. In order that this flame retarding mechanism work effectively, the value of c representative of the content of organooxy groups such as alkoxy groups and alkenyloxy groups in formula (3), that is, the number of moles of organooxy groups per mol of silicon atom should range from 0.42 to 2.5, preferably from 0.5 to 2.3 mol. With c less than 0.42, the organosiloxane becomes less crosslinkable so that it may not be fixed in proximity to burnt sites. With c exceeding 2.5, only organosiloxanes having a low molecular weight are prepared and such low molecular weight organosiloxanes can be gasified by heat and lost prior to fixation. In either case, the flame retarding effect is aggravated.

Although silanol groups (that is, hydroxyl groups each attached to a silicon atom) in the organosiloxane of formula (3) are less reactive and contribute little to flame retardance, the value of d representative of the content of silanol groups is up to 0.35, preferably from 0 to 0.2 from the standpoints of storage stability and workability.

Another important factor for the above flame retarding mechanism to work effectively is the content of phenyl groups. In formula (3), the value of a representative of the content of phenyl groups, that is, the number of moles of phenyl groups per mol of silicon atom should range from 0.5 to 2, preferably from 0.6 to 1.8. With a less than 0.5, the number of phenyl groups are too small to provide the flame retarding effect. With a exceeding 2, the phenyl content is fully high, but more structures having bulky phenyl groups concentrated on one silicon atom are contained to cause substantial steric hindrance and reduce the degree of spatial freedom of the organopolysiloxane molecule. This prevents the overlapping of aromatic rings which is necessary for the flame retarding mechanism based on mutual coupling of aromatic rings to work effectively, resulting in poor flame retardant effect.

The organosiloxane of formula (3) may contain a substituent $R^4$ other than phenyl group as a substituent capable of bonding to Si to form a Si—C bond. Since this substituent $R^4$ is not directly relevant to the flame retarding effect, an increased content thereof brings a contrary result. However, an appropriate content of $R^4$ is effective for alleviating the steric hindrance of an organosiloxane molecule having a high content of bulky phenyl groups, to increase the degree of spatial freedom and facilitate the overlapping between phenyl rings, thereby improving the flame retarding effect. The content of $R^4$ within which this effect is expectable, that is, the value of b is up to 1. Preferably the ratio of b to a+b in formula (3), that is, b/(a+b) is from 0 to 0.3. With b/(a+b) in excess of 0.3, the relative content of phenyl groups would become low, failing to fully achieve the flame retarding effect.

Preferably, the organosiloxane (C) contains in its molecule trifunctional siloxane units of the following general formula (4):

$$R^6SiX_3 \quad (4)$$

wherein $R^6$ is a hydrogen atom or a monovalent hydrocarbon group of 1 to 6 carbon atoms, and X is —OH, —$OR^5$ or a siloxane residue, at least one of the three X groups attached to the silicon atom is a siloxane residue. Note that the hydrocarbon group represented by $R^6$ is as defined for $R^3$ and $R^4$, and $R^5$ is as defined above.

The term "siloxane residue" used herein designates a ≡Si—O— linkage wherein the oxygen atom bonds with another silicon atom to form a siloxane bond. Illustratively, the siloxane residue is represented by $O_{1/2}$ when one of the X groups is a siloxane residue, $O_{2/2}$ when two of the X groups are siloxane residues, and $O_{3/2}$ when the three X groups are siloxane residues. These oxygen atoms bond with other silicon atoms to form siloxane bonds. Illustrative representations of the unit of formula (4) are given below.

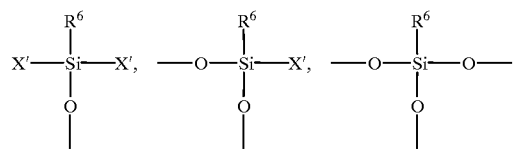

In the formulae, $R^6$ is as defined above, and X' is OH or $OR^5$.

These trifunctional siloxane units of formula (4) form a three-dimensional crosslink structure to strengthen the molecular structure of organosiloxane to impart resinous nature thereto, thereby improving the dispersibility of the organosiloxane in the epoxy resin composition and the processability of the composition. As opposed to an organosiloxane of a linear molecular structure containing more monofunctional or difunctional siloxane units that tends to form a volatile low molecular weight siloxane through the rearrangement of siloxane bonds induced by the heat during combustion so that it may escape from the system, an organosiloxane containing more trifunctional siloxane units of formula (4) with high crosslinking reactivity converts to a higher molecular weight one which remains in the system to contribute to flame retardance. Better flame retardant effect is achieved when organopolysiloxanes of formula (3) contain at least 50 mol %, preferably at least 60 mol %, especially 70 to 100 mol % of trifunctional siloxane units of formula (4) per all the siloxane units in a molecule. If the trifunctional siloxane units of formula (4) are less than 50 mol %, their effect would become lower.

As constituent units other than the trifunctional siloxane units of formula (3), the organosiloxane (C) may contain difunctional, monofunctional and tetrafunctional siloxane units in such amounts as not to affect the physical properties thereof. In particular, the tetrafunctional siloxane units contribute to the flame retarding effect because they form a three-dimensional crosslink structure to strengthen the molecular structure of organosiloxane and their high crosslinking reactivity converts the organosiloxane to a higher molecular weight one which remains in the system to contribute to flame retardance. However, since a higher content of tetrafunctional siloxane units reduces the dispersibility in the epoxy resin, the desired content is up to 50 mol % per all the siloxane units in a molecule.

The organosiloxane of formula (3) preferably has an average degree of polymerization of 2.5 to 100, more preferably 2.5 to 50, especially 2.5 to 20, and a weight average molecular weight of 410 to less than 2,000. The weight average molecular weight and average degree of polymerization may be determined as weight average values (typically based on polystyrene) by gel permeation chromatography (GPC). The degree of polymerization is a crucial factor that governs the flame retardant effect. Organosiloxanes with an average degree of polymerization in the above range are well dispersible upon melt mixing, but localized so that the heat during combustion may cause the organosiloxane to melt and migrate to gather in proximity to burnt sites. This ease of migration also facilitates overlapping of phenyl groups for further improving the flame retardant effect. However, a low molecular weight organosiloxane having an average degree of polymerization of less than 2.5 can be lost through gasification with the heat during combustion, with the flame retardant effect being reduced. Organosiloxanes having an average degree of polymerization of more than 100 have the problems that the ease of migration during combustion is lost to reduce the flame retardant effect and their dispersion in the epoxy resin is exacerbated.

The organosiloxanes of formula (3) may be prepared by well-known methods. For example, an organochlorosilane capable of forming the above-mentioned siloxane unit is reacted with an alcohol in excess of the necessity to react with all chloro groups and water to form an alkoxy-bearing organosilane. The unreacted alcohol, water and hydrogen chloride as the reaction by-product are removed by vacuum stripping or other suitable means, obtaining the end product. In order to prepare an organosiloxane having the desired alkoxy content or average molecular weight, the amounts of alcohol and water to be reacted are adjusted. An organosiloxane approximate to the desired structure can be obtained when water is used in a theoretical amount to achieve the desired average molecular weight and the alcohol used in excess of a theoretical amount to achieve the desired alkoxy content.

If an alkoxysilane capable of forming the above-mentioned siloxane unit is available, a method of effecting partial hydrolytic condensation reaction in the presence of water in a theoretical amount to achieve the desired average molecular weight is possible. In this case, an acid, base or organometallic compound is preferably added as a catalyst for promoting the reaction. The alcohol by-product is removed by distillation under atmospheric pressure or vacuum stripping, yielding the end product. When it is desired to further increase the storage stability, the reaction catalyst added may be removed by neutralization, for example. In any of these methods, an organic solvent may be blended for the purpose of preventing gel formation or restraining a molecular weight distribution from spreading.

The amount of organosiloxane (C) blended in the epoxy resin composition of the invention is preferably 0.1 to 50 parts, more preferably 2 to 20 parts by weight, per 100 parts by weight of the epoxy resin (A) and curing agent (B) combined. Less than 0.1 part of organosiloxane (C) on this basis would be too small to impart flame retardance whereas more than 50 parts of organosiloxane (C) can increase the viscosity during molding and adversely affect the outer appearance and strength of molded parts.

In the epoxy resin composition of the invention, an inorganic filler (D) is blended. It may be selected from inorganic fillers commonly used in conventional epoxy resin composition. Exemplary inorganic fillers include silicas such as fused silica and crystalline silica, alumina, silicon nitride, aluminum nitride, boron nitride, titanium oxide, and glass fibers.

No particular limits are imposed on the mean particle size and shape of the inorganic filler. Spherical fused silica having a mean particle diameter of 5 to 40 $\mu$m is especially preferable from the standpoints of molding and flow. The mean particle size can be determined as a weight average value or median diameter by a particle size distribution measuring device based on such a process as laser light diffraction process.

In order to enhance the bond strength between the resin and the inorganic filler, it is preferred to use the inorganic filler which has been surface treated with coupling agents such as silane coupling agents and titanate coupling agents. Exemplary silane coupling agents include epoxy-functional alkoxysilanes such as γ-glycidoxypropyltrimethoxysilane, γ-glycidoxypropylmethyldiethoxysilane, and β-(3,4-epoxycyclohexyl)-ethyltrimethoxysilane, amino-functional alkoxysilanes such as N-β-(aminoethyl)-γ-aminopropyltrimethoxysilane, γ-aminopropyltriethoxysilane, and N-phenyl-γ-aminopropyltrimethoxysilane, and mercapto-functional alkoxysilanes such as γ-mercaptopropyltrimethoxysilane. The amount of coupling agent used and the surface treating method are not critical.

An appropriate amount of the inorganic filler is about 400 to about 1,100 parts, especially about 600 to about 900 parts by weight per 100 parts by weight of the epoxy resin (A) and the curing agent (B) combined. Epoxy resin compositions loaded with less than 400 parts of the filler would have a high coefficient of expansion so that greater stresses may be applied to semiconductor devices to exacerbate the characteristics thereof, and fail to achieve the desired flame retardant properties because of a relatively large proportion of the resin component to the overall composition. Epoxy resin compositions loaded with more than 1,100 parts of the filler would have a too high viscosity during molding and be difficult to mold. When expressed in percent by weight, the inorganic filler preferably accounts for 75 to 92% by weight, especially 83 to 90% by weight of the composition.

In the practice of the invention, a curing accelerator is preferably blended to accelerate the curing reaction of the epoxy resin with the curing agent. Use may be made of any of curing accelerators that can promote the curing reaction, for example, organic phosphorus compounds such as triphenylphosphine, tributylphosphine, tri(p-methylphenyl) phosphine, tri(nonylphenyl)phosphine, triphenylphosphine-triphenylboran, and tetraphenylphosphonium-tetraphenyl borate; tertiary amine compounds such as triethylamine, benzyldimethylamine, α-methyl-benzyldimethylamine, and 1,8-diazabicyclo[5.4.0]undecene-7; and imidazole compounds such as 2-methylimidazole, 2-phenylimidazole, 2-phenyl-4-methylimidazole, 2-ethylimidazole, 4-methylimidazole, 4-ethylimidazole, 2-phenyl-4-hydroxymethylimidazole, 2-ethyl-4-methylimidazole, 1-cyanoethyl-2-methylimidazole, 2-phenyl-4-methyl-5-hydroxymethylimidazole, and 2-phenyl-4,5-dihydroxymethylimidazole.

In the semiconductor-encapsulating epoxy resin composition of the invention, any of well-known additives may be blended, if necessary, for example, stress-reducing agents such as thermoplastic resins, thermoplastic elastomers, organic synthetic rubbers, and silicones; waxes such as carnauba wax, higher fatty acids, and synthetic waxes; colorants such as carbon black; and halogen trapping agents. These additives may be blended in conventional amounts insofar as the benefits of the invention are not impaired.

The epoxy resin composition of the invention may be prepared by blending the epoxy resin, curing agent, inorganic filler and other additives in accordance with a predetermined formulation, thoroughly and uniformly mixing these components in a mixer, melting and working the mixture in a hot roll mill, kneader or extruder, followed by cooling for solidification and grinding into a molding material of a suitable size.

The epoxy resin composition thus obtained can be effectively utilized as an encapsulant for a variety of semiconductor devices. Low-pressure transfer molding is the process most commonly used for encapsulation. Desirably, the epoxy resin composition of the invention is molded at a temperature of about 150 to 180° C. for about 30 to 180 seconds and post-cured at a temperature of about 150 to 180° C. for about 2 to 16 hours.

There has been described an epoxy resin composition for semiconductor encapsulation which is effectively moldable and cures into a product having improved reflow crack resistance, improved moisture resistance, and high flame retardance. Since halogenated epoxy resins and antimony trioxide are excluded, the resin composition of the invention is safe and not detrimental to human and the environment. Therefore, a semiconductor device encapsulated with the composition in a cured state remains highly reliable.

EXAMPLE

Examples of the invention are given below by way of illustration and not by way of limitation. All parts are by weight. The average degree of polymerization and average molecular weight are weight average values.

Preparation Example 1

A 1-liter flask equipped with a stirrer, condenser, and thermometer was charged with 211 g (1 mol) of phenyltrichlorosilane and 143 g of toluene and heated to an internal temperature of 40° C. in an oil bath. A dropping funnel was charged with 64 g (2 mol) of methanol, which was added dropwise to the flask over one hour while stirring. Alkoxylation proceeded while hydrogen chloride gas evolving during the reaction was taken out of the system. After the completion of addition, agitation was continued for one hour for ripening at an internal temperature of 40° C. The dropping funnel was then charged with 12 g (0.7 mol) of water, which was added dropwise to the flask over one hour. Hydrolytic condensation proceeded while hydrogen chloride gas evolving during the reaction was taken out of the system. After the completion of addition, agitation was continued for one hour for ripening at an internal temperature of 40° C. This was followed by vacuum distillation to remove the toluene, the excess of methanol, unreacted water, and hydrogen chloride, yielding 151 g of a methoxy group-bearing organosiloxane in liquid form.

The resulting organosiloxane was expressed by the formula:

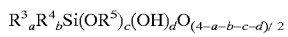

wherein $R^3$ is a phenyl group and a=1.0, b=0, b/(a+b)=0, indicating that 100 mol % of the organic substituents attached to the silicon atom to form Si—C bonds are phenyl groups, $R^5$ is a methyl group, c=1.5, and d=0.2, and 100 mol % of trifunctional siloxane units per all the siloxane units are contained. It appeared to be a colorless clear liquid and had an average degree of polymerization of 3 and an average molecular weight of 500.

Preparation Example 2

The procedure of Preparation Example 1 was repeated except that the 1-liter flask was charged with 159 g (0.75 mol) of phenyltrichlorosilane, 37 g (0.25 mol) of methyltrichlorosilane and 143 g of toluene, the dropping funnel was charged with 48 g (1.5 mol) of methanol which was added for alkoxylation, and the dropping funnel was then charged with 18 g (1 mol) of water which was added for hydrolytic condensation. There was obtained 120 g of a methoxy group-bearing organosiloxane in liquid form.

The resulting organosiloxane was expressed by the formula:

wherein $R^3$ is a phenyl group, $R^4$ is a methyl group and a=0.75, b=0.25, b/(a+b)=0.25, indicating that 75 mol % and 25 mol % of the organic substituents attached to the silicon atom to form Si—C bonds are phenyl groups and methyl groups, respectively, $R^5$ is a methyl group, c=1.0, and d=0.17, and 100 mol % of trifunctional siloxane units per all the siloxane units are contained. It appeared to be a colorless clear liquid and had an average degree of polymerization of 14 and an average molecular weight of 1,900.

Preparation Example 3

The procedure of Preparation Example 1 was repeated except that the 1-liter flask was charged with 85 g (0.4 mol) of phenyltrichlorosilane, 91 g (0.6 mol) of tetramethoxysilane and 64 g of methanol, and the dropping funnel was charged with 16 g of a 30% hydrochloric acid aqueous solution (0.6 mol of water). There was obtained 125 g of a methoxy group-bearing organosiloxane.

The resulting organosiloxane was expressed by the formula:

wherein $R^3$ is a phenyl group and a=0.4, b=0, b/(a+b)=0, indicating that 100 mol % of the organic substituents attached to the silicon atom to form Si—C bonds are phenyl groups, $R^5$ is a methyl group, c=2.6, and d=0.1, and 40 mol % of trifunctional siloxane units and 60 mol % of tetrafunctional siloxane units (i.e., the hydrolyzed residue of tetramethoxysilane) per all the siloxane units are contained. It appeared to be a colorless clear liquid and had an average degree of polymerization of 2 and an average molecular weight of 300.

Examples and Comparative Examples

The components shown in Table 1 were uniformly melt mixed in a hot twin-roll mill, cooled and ground, obtaining epoxy resin compositions for semiconductor encapsulation. The components used are as follows.

Epoxy resin:

(a) Epoxy resin of formula (1-1), NC3000P (Nihon Kayaku K.K.), epoxy equivalent 272, melt viscosity 0.8 poise as measured at 150° C. by a cone plate type ICI viscometer

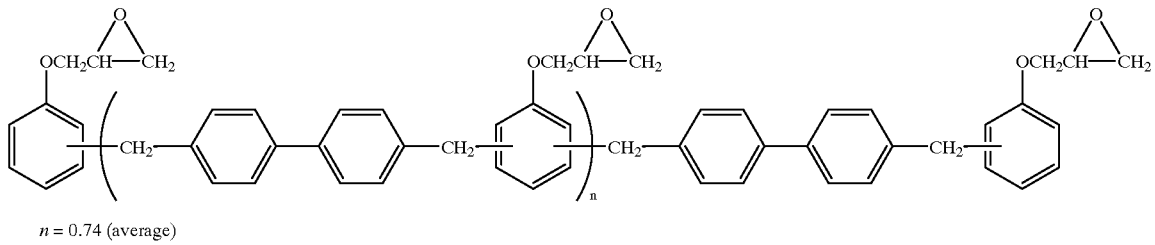

(1-1)

$n = 0.74$ (average)

(b) Biphenyl type epoxy resin, YX4000HK (Yuka Shell K.K.), epoxy equivalent 190
(c) o-cresol novolac type epoxy resin, EOCN1020-55 (Nihon Kayaku K.K.), epoxy equivalent 200

Curing agent:
(d) Phenolic resin of formula (2-1), MEH7851L (Meiwa Chemicals K.K.), phenol equivalent 199, melt viscosity 0.8 poise as measured at 150° C. by a cone plate type ICI viscometer (1) Spiral Flow
Measured by molding at 175° C. and 70 kgf /cm² for a molding time of 120 seconds in a mold in accordance with EMMI standards.

(2) Hardness When Molded
Using the method described in JIS-K6911, a rod measuring 10×4×100 mm was molded at 175° C. and 70 kgf/cm² for a time of 90 seconds. The hardness when hot was measured with a Barcol Impressor.

(3) Flame Retardance

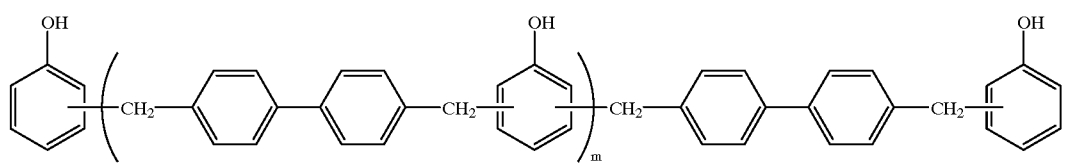

(2-1)

$m = 0.44$ (average)

(e) Phenolaralkyl resin, MEH7800SS (Meiwa Chemicals K.K.), phenol equivalent 175

Flame retardant:
The organosiloxanes obtained in Preparation Examples 1 to 3 (abbreviated as PE1 to PE3 in Table 1)

Inorganic filler:
Spherical fused silica with a mean particle diameter of 13 μm

Curing accelerator:
Triphenylphosphine

Parting agent:
Hydrotalcite, DHT4A (Kyowa Chemical Industry K.K.)
Carnauba wax (Nikko Fine Products K.K.)

Silane coupling agent:
γ-glycidoxypropyltrimethoxysilane KBM403 (Shin-Etsu Chemical Co., Ltd.)

These compositions were measured for the following properties. The results are given in Table 1.

A 1/16 inch thick sheet was molded and examined for flame retardance in accordance with UL 94 test specifications.

(4) Moisture Resistance

A silicon chip measuring 6×6 mm on which aluminum wiring had been formed was adhesively bonded to a 14-pin dual in-line package (DIP) frame (Alloy 42), and the aluminum electrodes on the chip surface were wire bonded to the lead frame using gold wire with a diameter of 30 μm. The epoxy resin composition was then molded over the chip at 175° C. and 70 kgf/cm² for a time of 120 seconds, and post-cured at 180° C. for 4 hours. Twenty packages thus obtained were left to stand for 500 hours at 140° C. and 85% relative humidity while being subjected to a bias voltage of 5V DC. The number of packages in which aluminum corrosion arose was counted.

TABLE 1

| | E1 | E2 | E3 | E4 | E5 | E6 | E7 | CE1 | CE2 | CE3 | CE4 |
|---|---|---|---|---|---|---|---|---|---|---|---|
| Composition (parts by weight) | | | | | | | | | | | |
| Epoxy resin (a) | 52.83 | 55.33 | 47.83 | 52.83 | 35.88 | 57.94 | 40.48 | 57.83 | 52.83 | — | 57.83 |
| Epoxy resin (b) | — | — | — | — | 13.95 | — | 15.92 | — | — | — | — |
| Epoxy resin (c) | — | — | — | — | — | — | — | — | — | 59.42 | — |
| Phenolic resin (d) | 37.17 | 39.67 | 32.17 | 37.17 | 40.17 | 23.44 | 24.52 | 42.17 | 37.17 | — | 42.17 |

TABLE 1-continued

|  | E1 | E2 | E3 | E4 | E5 | E6 | E7 | CE1 | CE2 | CE3 | CE4 |
|---|---|---|---|---|---|---|---|---|---|---|---|
| Phenolic resin (e) | — | — | — | — | — | 8.62 | 9.02 | — | — | 30.48 | — |
| Flame retardant (organosiloxane) | | | | | | | | | | | |
| Type | PE1 | PE1 | PE1 | PE2 | PE1 | PE1 | PE1 | — | PE3 | PE1 | — |
| Amount | 10 | 5 | 20 | 10 | 10 | 10 | 10 | — | 10 | 10 | — |
| Aluminum hydroxide | — | — | — | — | — | — | — | — | — | — | 50 |
| Inorganic filler | 700 | 700 | 700 | 700 | 700 | 700 | 700 | 700 | 700 | 450 | 700 |
| Curing accelerator | 1.2 | 1.2 | 1.2 | 1.2 | 1.2 | 1.2 | 1.2 | 1.2 | 1.2 | 1.2 | 1.2 |
| Parting agent | 3 | 3 | 3 | 3 | 3 | 3 | 3 | 3 | 3 | 3 | 3 |
| Carbon black | 2 | 2 | 2 | 2 | 2 | 2 | 2 | 2 | 2 | 2 | 2 |
| Silane coupling agent | 1 | 1 | 1 | 1 | 1 | 1 | 1 | 1 | 1 | 1 | 1 |
| Spiral flow (cm) | 90 | 85 | 90 | 90 | 95 | 90 | 100 | 90 | 90 | 110 | 70 |
| Hardness as molded | 75 | 78 | 75 | 75 | 80 | 80 | 83 | 75 | 75 | 85 | 30 |
| Flame retardance | V-0 | V-0 | V-0 | V-0 | V-0 | V-0 | V-0 | V-1 | V-1 | burned | V-0 |
| Moisture resistance | 0/20 | 0/20 | 0/20 | 0/20 | 0/20 | 0/20 | 0/20 | 0/20 | 0/20 | 0/20 | 20/20 |

As seen from Table 1, the epoxy resin compositions within the scope of the invention are easy to mold and produce cured parts having improved reflow crack resistance, improved moisture resistance, and high flame retardant rating. They have no ill effects on human health and the environment and are safe since they contain no halogenated epoxy resins or antimony trioxide.

Japanese Patent Application No. 152071/1998 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

What is claimed is:

1. An epoxy resin composition for semiconductor encapsulation comprising, in admixture, (A) an epoxy resin of the following general formula (1):

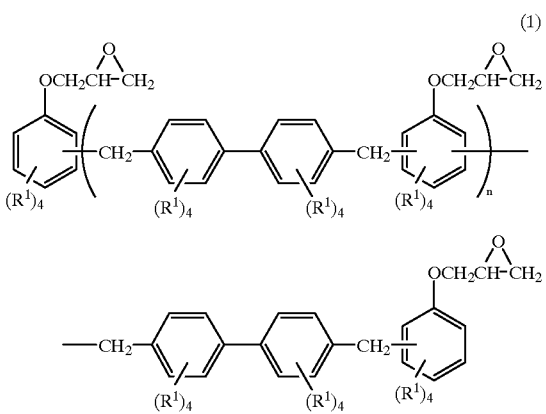

wherein $R^1$ which may be the same or different is a hydrogen atom, an alkyl group of 1 to 4 carbon atoms, or a phenyl group, and n is an integer of 0 to 10, (B) a phenolic resin curing agent of the following general formula (2):

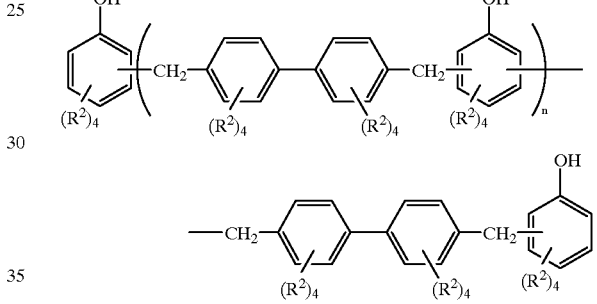

wherein $R^2$ which may be the same or different is a hydrogen atom, an alkyl group of 1 to 4 carbon atoms, or a phenyl group, and m is an integer of 0 to 10, (C) a phenyl and organooxy-bearing organosiloxane of the following average compositional formula (3):

$$R^3{}_a R^4{}_b Si(OR^5)_c(OH)_d O_{(4-a-b-c-d)/2} \quad (3)$$

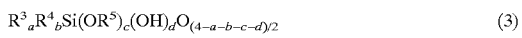

wherein $R^3$ is a phenyl group, $R^4$ is a hydrogen atom or a monovalent hydrocarbon group of 1 to 6 carbon atoms, $R^5$ is a monovalent hydrocarbon group of 1 to 4 carbon atoms, a, b, c and d are numbers satisfying $0.5 \leq a \leq 2$, $0 \leq b \leq 1$, $0.42 \leq c \leq 2.5$, $0 \leq d \leq 0.35$, and $0.92 \leq a+b+c+d \leq 2.8$, and (D) an inorganic filler.

2. The epoxy resin composition of claim 1 wherein the phenyl and organooxy-bearing organosiloxane (C) has an average degree of polymerization of 2.5 to 100.

3. The epoxy resin composition of claim 1 wherein the phenyl and organooxy-bearing organosiloxane (C) contains per all the siloxane units in its molecule at least 50 mol % of trifunctional siloxane units of the following general formula (4):

$$R^6 SiX_3 \quad (4)$$

wherein $R^6$ is a hydrogen atom or a monovalent hydrocarbon group of 1 to 6 carbon atoms as defined for $R^3$ and $R^4$, and X is —OH, —$OR^5$ or a siloxane residue, wherein $R^5$ is as defined above, at least one of the three X groups attached to the silicon atom is a siloxane residue.

4. A semiconductor device encapsulated with the epoxy resin composition of claim 1 in a cured state.

5. A semiconductor device encapsulated with the epoxy resin composition of claim 2 in a cured state.

6. A semiconductor device encapsulated with the epoxy resin composition of claim 3 in a cured state.

7. The epoxy resin composition of claim 1 wherein n is an integer of 0 to 4.

8. The epoxy resin composition of claim 1 wherein n is an integer of 0 to 2.

9. The epoxy resin composition of claim 1 wherein m is an integer of 0 to 4.

10. The epoxy resin composition of claim 1 wherein m is an integer of 0 to 2.

11. The epoxy resin composition of claim 1 wherein $R^4$ is an alkyl group of 1 to 6 carbon atoms or an alkenyl group of 2 to 6 carbon atoms.

12. The epoxy resin composition of claim 1 wherein $R^4$ is a methyl or vinyl group.

13. The epoxy resin composition of claim 1 wherein $R^5$ is selected from the group consisting of methyl, ethyl, propyl, isopropyl, butyl, isobutyl and tert-butyl.

\* \* \* \* \*